US009935551B2

(12) United States Patent
Kataoka et al.

(10) Patent No.: US 9,935,551 B2
(45) Date of Patent: Apr. 3, 2018

(54) SWITCHING CIRCUIT INCLUDING SERIALLY CONNECTED TRANSISTORS FOR REDUCING TRANSIENT CURRENT AT TIME OF TURNING OFF, AND POWER SUPPLY CIRCUIT PROVIDED THEREWITH

(71) Applicant: Sharp Kabushiki Kaisha, Sakai, Osaka (JP)

(72) Inventors: Kohtaroh Kataoka, Sakai (JP); Takeshi Shiomi, Sakai (JP); Shuji Wakaiki, Sakai (JP); Hiroki Igarashi, Sakai (JP); Akihide Shibata, Sakai (JP); Hiroshi Iwata, Sakai (JP)

(73) Assignee: Sharp Kabushiki Kaisha, Sakai, Osaka (JP)

( * ) Notice: Subject to any disclaimer, the term of this patent is extended or adjusted under 35 U.S.C. 154(b) by 0 days.

(21) Appl. No.: 15/316,859

(22) PCT Filed: Feb. 24, 2015

(86) PCT No.: PCT/JP2015/055159
§ 371 (c)(1),
(2) Date: Dec. 7, 2016

(87) PCT Pub. No.: WO2016/002249
PCT Pub. Date: Jan. 7, 2016

(65) Prior Publication Data
US 2017/0104416 A1    Apr. 13, 2017

(30) Foreign Application Priority Data
Jun. 30, 2014  (JP) .................. 2014-134134

(51) Int. Cl.
*H02M 3/158*  (2006.01)
*H02M 3/155*  (2006.01)
*H03K 17/08*  (2006.01)

(52) U.S. Cl.
CPC ............ *H02M 3/158* (2013.01); *H03K 17/08* (2013.01); *H02M 2003/1555* (2013.01)

(58) Field of Classification Search
CPC ........... H02M 2001/0009; H02M 1/32; H02M 7/53871; H03K 17/0822; H03K 2217/0036; G01R 19/165; G01R 19/16519
See application file for complete search history.

(56) References Cited

U.S. PATENT DOCUMENTS 5,748,025 A     5/1998  Ng et al.
8,890,496 B2 *  11/2014 Inoue .................... H02M 3/158
                                                      323/271

(Continued)

FOREIGN PATENT DOCUMENTS

JP    2006-324839 A    11/2006
JP    2009-195054 A    8/2009

(Continued)

OTHER PUBLICATIONS

Written Opinion of the International Searching Authority PCT/ISA/237 for International Application No. PCT/JP2015/055159 dated Apr. 14, 2015.

(Continued)

*Primary Examiner* — Jeffrey Gblende
*Assistant Examiner* — David A. Singh
(74) *Attorney, Agent, or Firm* — Steve Reiss; ScienBiziP, P.C.

(57) ABSTRACT

A high-withstand-voltage normally-on transistor and a low-withstand-voltage normally-off transistor are connected in series, and diodes are provided in reverse parallel to the transistor. A gate terminal of the transistor is connected to a source terminal of the transistor, and a gate driving circuit that outputs a control signal to a gate terminal of the (Continued)

transistor is provided. Forward voltage of the diode is made lower than forward voltage of the diode, and an inductance component of a path connecting nodes via the diode is made greater than an inductance component of a path connecting the nodes via the diode. Accordingly, a switching circuit which includes transistors connected in series and in which transient current at a time of turning off is reduced is provided.

15 Claims, 6 Drawing Sheets

(56) References Cited

U.S. PATENT DOCUMENTS

| | | | | |
|---|---|---|---|---|
| 9,000,738 | B2* | 4/2015 | Heid | H01J 37/32009 323/230 |
| 9,245,956 | B2* | 1/2016 | Okumura | H02M 7/003 |
| 9,276,569 | B2* | 3/2016 | Ikeda | H01L 25/072 |
| 2002/0185993 | A1* | 12/2002 | Qian | H02M 3/158 323/282 |
| 2009/0206812 | A1 | 8/2009 | Sasaya et al. | |
| 2012/0087167 | A1 | 4/2012 | Kuzumaki et al. | |
| 2013/0083580 | A1 | 4/2013 | Komiya et al. | |
| 2015/0028841 | A1* | 1/2015 | Cesnak | H02M 1/34 323/311 |
| 2015/0171750 | A1* | 6/2015 | Zeng | H02M 1/08 323/311 |
| 2016/0219660 | A1* | 7/2016 | Kelly | H02M 3/158 |

FOREIGN PATENT DOCUMENTS

| | | |
|---|---|---|
| JP | 2011-010487 A | 1/2011 |
| JP | 2013-085448 A | 5/2013 |

OTHER PUBLICATIONS

International Search Report PCT/ISA/210 for International Application No. PCT/JP2015/055159 dated Apr. 14, 2015.

* cited by examiner

SWITCHING CIRCUIT INCLUDING SERIALLY CONNECTED TRANSISTORS FOR REDUCING TRANSIENT CURRENT AT TIME OF TURNING OFF, AND POWER SUPPLY CIRCUIT PROVIDED THEREWITH

TECHNICAL FIELD

The present invention relates to a switching circuit and a power supply circuit, and particularly relates to a switching circuit including transistors connected in series, and a power supply circuit provided therewith.

BACKGROUND ART

A power transistor generally has normally-on characteristics with which drain current flows when voltage between a gate and a source is 0 V. Thus, when drain voltage is applied without applying sufficient negative polarity voltage to a gate terminal of the power transistor, large current flows and the power transistor may be broken. Accordingly, the power transistor is more difficult to be handled than normally-off transistors such as a bipolar transistor and a metal-oxide-semiconductor field-effect transistor (MOSFET).

Thus, a switching circuit in which a high-withstand-voltage normally-on transistor and a low-withstand-voltage normally-off transistor are connected in series has been conventionally known. For example, FIG. 4 of PTL 1 illustrates a power conversion device that includes a circuit in which a normally-on junction FET and a MOSFET are connected in series. FIG. 1 of PTL 1 illustrates a power conversion device that includes a diode connected in reverse parallel to a circuit, in which a normally-on transistor and a normally-off transistor are connected in series, and controls gate voltage of the two transistors by using a gate driving circuit. PTL 2 describes a switching power supply device that includes a circuit in which a high-withstand-voltage normally-off transistor and a low-withstand-voltage normally-off transistor are connected in series.

CITATION LIST

Patent Literature

PTL 1: Japanese Unexamined Patent Application Publication No. 2011-10487
PTL 2: Japanese Unexamined Patent Application Publication No. 2013-85448

SUMMARY OF INVENTION

Technical Problem

However, a switching circuit in which a high-withstand-voltage normally-on transistor and a low-withstand-voltage normally-off transistor are connected in series has a problem that large transient current flows at a time of turning off. The problem will be described below with a switching circuit illustrated in FIG. 4.

Figure 4:
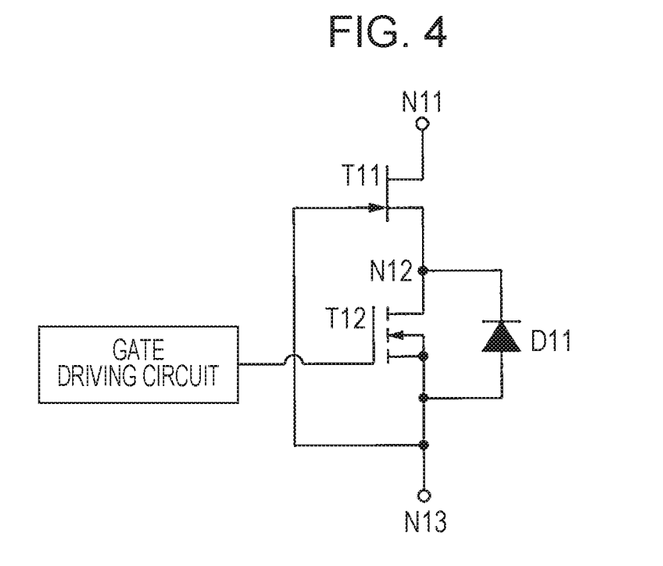
FIG. 4 is a circuit diagram of a switching circuit according to a first comparative example.

In FIG. 4, a transistor T11 is a high-withstand-voltage normally-on transistor, a transistor T12 is a low-withstand-voltage normally-off transistor, and a diode D11 is an internal diode of the transistor T12. Considered is a case where, when the transistor T12 is in an off state and current flows from a node N13 to a node N11, the current stops and a potential of the node N11 rises. For a while even after the potential of the node N11 starts to rise, the transistor T11 is kept in an on state and a potential of the node N12 rises with the rise of the potential of the node N11. The transistor T11 is switched off when voltage between a gate and a source is less than a threshold voltage.

If the transistor T11 is immediately switched off when the potential of the node N11 rises, a component due to a capacitance of the transient current at the time of turning off includes only current for charging a combined capacitance of a capacitance between a source and a drain of the transistor T11 and a capacitance between a source and a drain of the transistor T12. However, a time period in which the transistor T11 is in the on state actually exists after the potential of the node N11 rises. Therefore, the component due to the capacitance of the transient current at the time of turning off includes current for charging only the capacitance between the source and the drain of the transistor T12 through the transistor T11 in the on state. Thus, in the switching circuit illustrated in FIG. 4, the transient current at the time of turning off increases and a switching loss and noise become great accordingly.

Therefore, the invention aims to provide a switching circuit which includes transistors connected in series and in which transient current at a time of turning off is reduced, and a power supply circuit provided therewith.

Solution to Problem

A first aspect of the invention is a switching circuit, including:
a first transistor that has a first conductive terminal connected to a first node and a second conductive terminal connected to a second node;
a second transistor that has a first conductive terminal connected to the second node and a second conductive terminal connected to a third node;
a first diode that is provided in reverse parallel to the second transistor on a first path connecting the second and third nodes;
a second diode that is provided in reverse parallel to the second transistor on a second path connecting the second and third nodes; and
a driving circuit that outputs a control signal to a control terminal of the second transistor, in which
a control terminal of the first transistor is connected to the third node directly or via a passive element or a power supply circuit,
withstand voltage of the first transistor is higher than withstand voltage of the second transistor,
forward voltage of the second diode is lower than forward voltage of the first diode, and
an inductance component of the second path is greater than an inductance component of the first path.

According to a second aspect of the invention, in the first aspect of the invention,
the first transistor is a normally-on transistor,
the second transistor is a normally-off transistor, and
the control terminal of the first transistor is connected to the third node directly or via the passive element.

According to a third aspect of the invention, in the first aspect of the invention,
the first and second transistors are normally-off transistors, and
the control terminal of the first transistor is connected to the third node via the power supply circuit.

A fourth aspect of the invention, in the first aspect of the invention, further includes a protection diode that is provided in reverse parallel to the second transistor on a third path connecting the second and third nodes, in which forward voltage of the protection diode is higher than the forward voltage of the second diode.

According to a fifth aspect of the invention, in the fourth aspect of the invention, an inductance component of the third path is smaller than the inductance component of the second path.

According to a sixth aspect of the invention, in the first aspect of the invention, the first diode is an internal diode of the second transistor.

According to a seventh aspect of the invention, in the first aspect of the invention, a wire length of the second path is longer than a wire length of the first path.

An eighth aspect of the invention, in the first aspect of the invention, further includes a capacitor provided in parallel to the second diode.

A ninth aspect of the invention is a power supply circuit, including:

an upper-side switching circuit provided in an upper-side arm;

a lower-side switching circuit provided in a lower-side arm; and a coil, one terminal of which is connected to an arm connection point, in which at least one of the upper-side and lower-side switching circuits is a switching circuit that includes:

a first transistor that has a first conductive terminal connected to a first node and a second conductive terminal connected to a second node;

a second transistor that has a first conductive terminal connected to the second node and a second conductive terminal connected to a third node;

a first diode that is provided in reverse parallel to the second transistor on a first path connecting the second and third nodes;

a second diode that is provided in reverse parallel to the second transistor on a second path connecting the second and third nodes; and a driving circuit that outputs a control signal to a control terminal of the second transistor, and in which a control terminal of the first transistor is connected to the third node directly or via a passive element or a power supply circuit, withstand voltage of the first transistor is higher than withstand voltage of the second transistor, forward voltage of the second diode is lower than forward voltage of the first diode, and an inductance component of the second path is greater than an inductance component of the first path.

According to a tenth aspect of the invention, in the ninth aspect of the invention, the upper-side switching circuit is the switching circuit, and the lower-side switching circuit includes a third transistor and a second driving circuit that outputs a pulse width modulation signal to a control terminal of the third transistor.

According to an eleventh aspect of the invention, in the ninth aspect of the invention, the lower-side switching circuit is the switching circuit, and the upper-side switching circuit includes a third transistor and a second driving circuit that outputs a pulse width modulation signal to a control terminal of the third transistor.

According to a twelfth aspect of the invention, in the tenth or eleventh aspect of the invention, the driving circuit outputs, to a control terminal of the second transistor, a signal that complementarily changes with respect to the pulse width modulation signal while having a dead time.

According to a thirteenth aspect of the invention, in the ninth aspect of the invention, each of the upper-side and lower-side switching circuits is the switching circuit.

According to a fourteenth aspect of the invention, in the ninth aspect of the invention, the switching circuit further includes a capacitor provided in parallel to the second diode.

Advantageous Effects of Invention

According to the first aspect of the invention, when current flows from the third node to the first node while the second transistor is in an off state, the current mainly flows through the second path between the third and second nodes. Therefore, when the current is reduced, counter electromotive force is generated by the inductance component of the second path and a potential of the second node changes so that the first transistor comes close to the off state. Thus, after the current is stopped, the first transistor is immediately switched off. Accordingly, it is possible to reduce transient current at a time of turning off.

According to the second aspect of the invention, it is possible to reduce the transient current at the time of turning off in the switching circuit that includes the normally-on transistor and the normally-off transistor connected in series.

According to the third aspect of the invention, it is possible to reduce the transient current at the time of turning off in the switching circuit that includes two normally-off transistors connected in series.

According to the fourth aspect of the invention, by providing the protection diode in reverse parallel to the second transistor, it is possible to prevent breakage of the second transistor due to excessive application of voltage.

According to the fifth aspect of the invention, it is possible to immediately prevent, for example, surge caused between the first and second conductive terminals of the second transistor.

According to the sixth aspect of the invention, by using the internal diode of the second transistor, it is possible to configure the switching circuit in which generation of surge when current starts to flow from the third node to the first node is suppressed.

According to the seventh aspect of the invention, by making the wire length of the second path longer, it is possible to provide the second path with the inductance component which causes counter electromotive force when current flowing through the second path is reduced.

According to the eighth aspect of the invention, by providing the capacitor in parallel to the second diode, it is possible to prevent, at a time of switching, high-frequency oscillation due to a capacitance component of the second diode and the inductance component of the second path, and operate the switching circuit stably.

According to the ninth aspect of the invention, it is possible to configure the power supply circuit in which a switching loss is reduced by using the switching circuit in which the transient current at the time of turning off is reduced.

According to the tenth aspect of the invention, by providing the switching circuit, in which the transient current at the time of turning off is reduced, in the upper-side arm and performing pulse width modulation for the third transistor provided in the lower-side arm, it is possible to configure a step-up chopper circuit in which a switching loss is reduced.

According to the eleventh aspect of the invention, by providing the switching circuit, in which the transient current at the time of turning off is reduced, in the lower-side arm and performing pulse width modulation for the third transistor provided in the upper-side arm, it is possible to configure a step-down chopper circuit in which a switching loss is reduced.

According to the twelfth aspect of the invention, by temporarily switching on the second transistor while the third transistor is in the off state, it is possible to cause current to flow through a channel of the second transistor, prevent voltage drop when the current passes through the first and second diodes, and reduce a conduction loss.

According to the thirteenth aspect of the invention, by providing the switching circuits, in which the transient current at the time of turning off is reduced, in the upper-side arm and the lower-side arm, it is possible to configure a bidirectional chopper circuit and an inverter in which a switching loss is reduced.

According to the fourteenth aspect of the invention, by providing the capacitor in parallel to the second diode, it is possible to prevent, at a time of switching, high-frequency oscillation due to a capacitance component of the second diode and the inductance component of the second path, and operate the switching circuit stably.

DESCRIPTION OF EMBODIMENTS

A switching circuit and a power supply circuit according to embodiments of the invention will be described below with reference to drawings. In the following description, current flowing through a diode in the switching circuit in a reverse direction when the switching circuit is turned off and reverse recovery current in a junction diode are referred to as "transient current at the time of turning off".

First Embodiment

Figure 1:
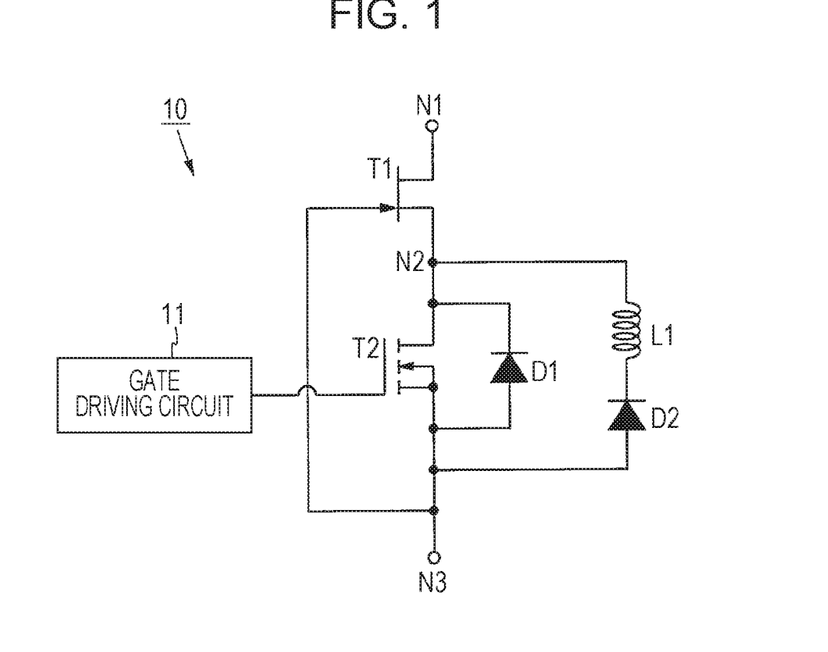
FIG. 1 is a circuit diagram of a switching circuit according to a first embodiment of the invention.

FIG. 1 is a circuit diagram of a switching circuit according to a first embodiment of the invention. A switching circuit 10 illustrated in FIG. 1 includes transistors T1 and T2, diodes D1 and D2, and a gate driving circuit 11. The switching circuit 10 has a high-withstand-voltage normally-on transistor and a low-withstand-voltage normally-off transistor that are connected in series.

In FIG. 1, the transistor T1 is an N-channel and high-withstand-voltage normally-on transistor. The transistor T2 is an N-channel and low-withstand-voltage normally-off transistor. The diode D1 is a PN junction diode. For example, an internal diode (also referred to as a parasitic diode) of the transistor T2 is used for the diode D1. The diode D2 is a diode whose forward voltage is lower than that of the diode D1. For example, a Schottky Barrier Diode is used for the diode D2. In this manner, in the switching circuit 10, withstand voltage of the transistor T1 is higher than withstand voltage of the transistor T2, and the forward voltage of the diode D2 is lower than the forward voltage of the diode D1.

A source terminal of the transistor T1 is connected to a drain terminal of the transistor T2. The diodes D1 and D2 are provided in reverse parallel to the transistor T2. Cathode terminals of the diodes D1 and D2 are connected to a source terminal of the transistor T1 and the drain terminal of the transistor T2. Anode terminals of the diodes D1 and D2 and a gate terminal of the transistor T1 are connected to a source terminal of the transistor T2. A gate terminal of the transistor T2 is connected to an output terminal of the gate driving circuit 11. Hereinafter, a node connected to a drain terminal of the transistor T1, a node connected to the drain terminal of the transistor T2, and a node connected to the source terminal of the transistor T2 are respectively denoted by N1, N2 and N3. A threshold voltage of the transistor T1 is set as (−Vth) and the forward voltage of the diode D2 is set as Vf (where, Vth>0, Vf>0).

Three current paths, that is, a path routed through a channel of the transistor T2, a path (hereinafter, referred to as a first path) routed through the diode D1, and a path (hereinafter, referred to as a second path) routed through the diode D2 are between the node N2 and the node N3. The switching circuit 10 is configured so that an inductance component of the second path is greater than an inductance component of the first path. For indicating such a characteristic, an inductance component L1 is illustrated in the second path of the figure.

In order to make the inductance component of the second path greater than the inductance component of the first path, for example, the wire length of the second path is made longer than the wire length of the first path. Specifically, a range of the target inductance component may be determined and wires of the second path may be laid out so as to achieve the inductance component within the range. The range of the target inductance component is determined as, for example, 10 nH to 200 nH. Thereby, it is possible to prevent element breakage caused by surge while obtaining an effect (reduction of transient current at the time of turning off) described below.

As a method for providing the second path with the inductance component, in addition to a method for forming the inductance component by devising the wiring layout on a printed board, there is a method for using a diode of a lead-wire type as the diode D2 and using a lead wire of the diode D2 as the inductance component. In this case, a size of the inductance component is able to be adjusted by changing a length of the lead wire from a board surface to a component. With such a method, it is possible to reduce an area of the board and reduce a size of the power supply circuit. There is also a method for arranging a ferrite bead in the second path, for example, by inserting the ferrite bead, which is obtained by processing a ferrite material into a donut shape, in the lead wire of the diode D2. With such a method, since the desired inductance component is able to be obtained even when the lead wire is shortened, it is possible to further reduce the size of the power supply circuit.

The inductance component L1 is provided in series with the diode D2 on the second path. In FIG. 1, the inductance component L1 is provided on the cathode terminal side of the diode D2. Alternatively, the inductance component L1 may be provided on the anode terminal side of the diode D2 or may be provided on both of the anode terminal side and the cathode terminal side of the diode D2. A gate resistance may be provided as necessary in each of gate wires of the transistors T1 and T2. In this manner, the gate terminal of the transistor T1 may be connected to the node N3 via a passive element such as a resistance element.

Figure 2:
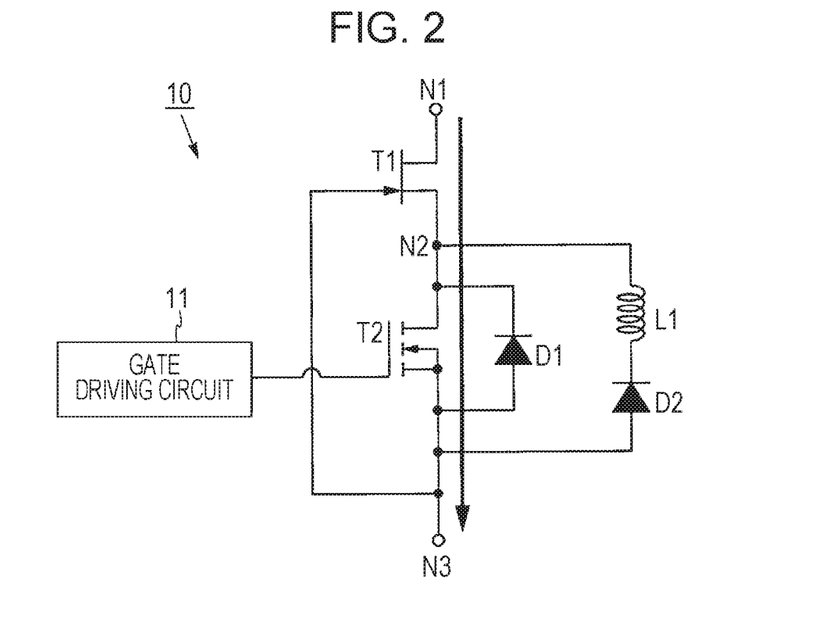
FIG. 2 illustrates a situation where current flows from a node N1 to a node N3 in the switching circuit illustrated in FIG. 1.
Figure 3:
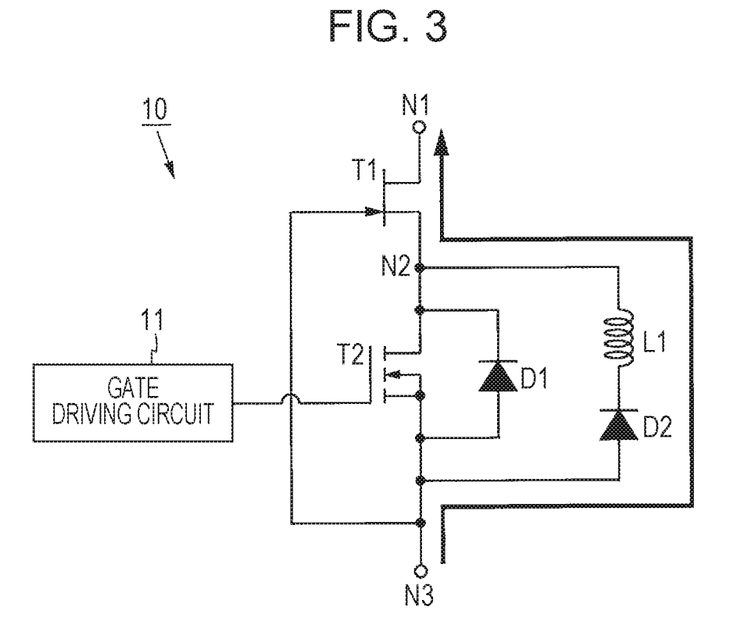
FIG. 3 illustrates a situation where current flows from the node N3 to the node N1 in the switching circuit illustrated in FIG. 1.

An operation of the switching circuit 10 will be described with reference to FIG. 2 and FIG. 3. First, a case where current flows from the node N1 to the node N3 will be described (refer to FIG. 2). In this case, the gate driving circuit 11 outputs an on signal (a signal for switching on the transistor T2). Then, the transistor T2 is switched on and a potential of the node N2 and a potential of the node N3 become almost equal, so that voltage between a gate and a source of the transistor T1 is almost 0 V. Thus, the normally-on transistor T1 is switched on and the current flows from the node N1 to the node N3.

When stopping the current flowing from the node N1 to the node N3, the gate driving circuit 11 outputs an off signal (a signal for switching off the transistor T2). Then, the transistor T2 is switched off. When there is an inductive load, the potential of the node N1 is increased as compared to the potential of the node N3 (hereinafter, the potential of the node N3 is set as a reference potential). For a while even after the transistor T2 is switched off, the transistor T1 is kept in the on state and the potential of the node N2 rises with the rise of the potential of the node N1. When the voltage between the gate and the source of the transistor T1 reaches (−Vth), the transistor T1 is switched off and the current flowing from the node N1 to the node N3 is stopped. Since the inductance component of the path routed through the channel of the transistor T2 is small, it is possible to perform excellent switching with small surge at the time of turning off.

Next, a case where current flows from the node N3 to the node N1 while the transistor T2 is in the off state will be described (refer to FIG. 3). While the transistor T2 is in the off state, almost no current flows through the channel of the transistor T2. On the other hand, the diodes D1 and D2 may cause the current to flow from the node N3 to the node N2. In particular, the first path routed through the diode D1 has a small inductance component, and thus allows the current to immediately flow without causing large surge even when the current starts to flow suddenly. At this time, since a cathode potential of the diode D1 is lower than an anode potential by the forward voltage, the voltage between the gate and the source of the transistor T1 is a slightly positive voltage, the normally-on transistor T1 is switched on, and the current starts to flow through the channel of the transistor T1 between the node N2 and the node N1. Here, since the forward voltage of the diode D2 is lower than the forward voltage of the diode D1, a steady-state current easily flows through the diode D2 compared to the diode D1. Thus, even in a case of flowing mainly through the first path routed through the diode D1 at a time when the current starts to flow, the current flowing from the node N3 to the node N2 is shifted to the second path routed through the diode D2 whose forward voltage is lower than that of the diode D1 and flows mainly through the second path (the path routed through the diode D2) after the current starts to flow. In this case as well, since the cathode potential of the diode D2 is lower than the anode potential by the forward voltage Vf, the voltage between the gate and the source of the transistor T1 is Vf. Since this voltage is positive, the normally-on transistor T1 is switched on and the current flows through the channel of the transistor T1 between the node N2 and the node N1 (FIG. 3).

Next, considered is a case where while the transistor T2 is in the off state, the current flowing from the node N3 to the node N1 is stopped and the potential of the node N1 is increased as compared to the potential of the node N3. As described above, the current mainly flows through the second path between the node N3 and the node N2. In a process where the current is reduced, counter electromotive force is generated by the inductance component L1 and the potential of the node N2 becomes higher than the potential of the node N3. Since the gate terminal of the transistor T1 is connected to the node N3, the transistor T1 comes close to the off state when the potential of the node N2 becomes high.

In this manner, in the switching circuit 10, not after the current flowing from the node N3 to the node N1 is completely stopped but in a process where this current is reduced, the transistor T1 comes close to the off state. Thus, after the current is stopped, the transistor T1 is immediately switched off. Accordingly, with the switching circuit 10, it is possible to reduce the transient current at the time of turning off.

An effect of the switching circuit 10 according to the present embodiment will be described below in comparison with a switching circuit (hereinafter, referred to as a switching circuit according to a comparative example) illustrated in FIG. 4. Compared to the switching circuit 10, the switching circuit according to the comparative example does not have components corresponding to the diode D2, the inductance component L1, and the second path.

Considered is a case where in the switching circuit according to the comparative example, current flowing from a node N13 to a node N11 is stopped while a transistor T12 is in the off state. In the switching circuit according to the comparative example, the current does not flow from the node N13 to the node N11 unless a forward bias is applied to a diode D11. Therefore, it is after the current flowing from the node N13 to the node N11 is stopped that a potential of a node N12 starts to rise. Thus, the transistor T11 is switched off with a delay as compared to the transistor T1 in the switching circuit 10.

When a potential difference is applied between the nodes N11 to N13, current for charging a capacitance between a source and a drain of each of the transistors T11 and T12 flows as transient current. In the switching circuit according to the comparative example, in a period when the transistor T11 is in the on state, current (transient current due to a first factor) for charging the capacitance between the source and the drain of the transistor T12 flows. Then, the potential of the node N12 further rises and the transistor T11 is switched off. After the transistor T11 is switched off, current (transient current due to a second factor) for charging a combined capacitance of the capacitance between the source and the drain of the transistor T11 and the capacitance between the source and the drain of the transistor T12 flows. In the switching circuit according to the comparative example, the transient current due to the first factor and the transient current due to the second factor flow at the time of turning off.

In the switching circuit according to the comparative example, due to impedance of wires connecting a gate terminal of the transistor T11 and the node N13, a delay may be generated until the transistor T11 is switched off after the potential of the node N12 rises. When this delay is long, there may be a case where the potential of the node N12 excessively rises before the transistor T11 is switched off and the transistor T12 is broken.

On the other hand, in the switching circuit 10 according to the present embodiment, the transistor T1 is immediately switched off at the time of turning off. Thus, it is possible to reduce the transient current due to the first factor at the time of turning off. It is also possible to prevent the potential of the node N2 from rising excessively before the transistor T1 is switched off and prevent breakage of the transistor T2.

As described above, the switching circuit 10 according to the present embodiment includes a first transistor T1 that has a first conductive terminal (drain terminal) connected to a first node N1 and a second conductive terminal (source terminal) connected to a second node N2, a second transistor T2 that has a first conductive terminal connected to the second node and a second conductive terminal connected to a third node N3, a first diode D1 that is provided in reverse parallel to the second transistor on a first path connecting the second and third nodes, a second diode D2 that is provided in reverse parallel to the second transistor on a second path connecting the second and third nodes, and a driving circuit (gate driving circuit 11) that outputs a control signal to a control terminal (gate terminal) of the second transistor. A control terminal of the first transistor is directly connected to the third node, withstand voltage of the first transistor is higher than withstand voltage of the second transistor, forward voltage of the second diode is lower than forward voltage of the first diode, and an inductance component of the second path is greater than an inductance component of the first path.

Thus, in a case where current flows from the third node to the first node while the second transistor is in the off state, the current flows through the first path, which has a small inductance component, when the current starts to flow, so that it is possible to suppress generation of surge even when the current increases suddenly. After the current starts to flow, the current mainly flows through the second path between the third node and the second node. Therefore, when the current is reduced, counter electromotive force is generated by the inductance component of the second path and a potential of the second node changes so that the first transistor comes close to the off state. Thus, the first transistor is immediately switched off after the current is stopped. Accordingly, it is possible to reduce the transient current at the time of turning off in a switching circuit including a normally-on transistor and a normally-off transistor that are connected in series.

In addition, by using an internal diode of the second transistor T2 as the first diode D1, it is possible to configure a switching circuit that suppresses generation of surge at a time when current starts to flow from the third node to the first node as described above by using the internal diode of the second transistor. When the wire length of the second path (path routed through the diode D2) is longer than the wire length of the first path (path routed through the diode D1), the inductance component L1 which causes counter electromotive force when the current flowing in the second path is reduced is able to be provided to the second path.

Note that, a modified example of the switching circuit 10 according to the present embodiment is able to be configured as follows. The switching circuit 10 may further include a protection diode that is provided in reverse parallel to the transistor T2 on a third path connecting the node N2 and the node N3 in order to protect the transistor T2. For example, a Zener diode that has higher forward voltage than that of the diode D2 is used for the protection diode. An anode terminal of the Zener diode is connected to the node N3 and a cathode terminal of the Zener diode is connected to the node N2. This makes it possible to prevent breakage of the transistor T2 due to excessive application of voltage. The current flowing from the node N3 to the node N2 while the transistor T2 is in the off state easily flows through the second path routed through the diode D2 whose forward voltage is low. Thus, it is possible to immediately switch off the transistor T1 when the current is stopped as described above.

In this case, a design is desired in which an inductance component of a third path (path routed through the protection diode and connecting the node N2 and the node N3) is smaller than the inductance component of the second path. Thereby, even when surge or the like is generated between a drain and a source of the transistor T2, the surge or the like is able to be removed immediately by an effect of the protection diode that is provided on the third path having a small inductance component.

The switching circuit 10 may further include a capacitor provided in parallel to the diode D2. One electrode of the capacitor is connected to the cathode terminal of the diode D2 and the other electrode of the capacitor is connected to the anode terminal of the diode D2. By providing the capacitor, it is possible to prevent, when the switching circuit 10 is switched, high-frequency oscillation due to a capacitance component of the diode D2 and the inductance component L1 of the second path in the switching circuit 10, and operate the switching circuit 10 stably.

Second Embodiment

Figure 5:
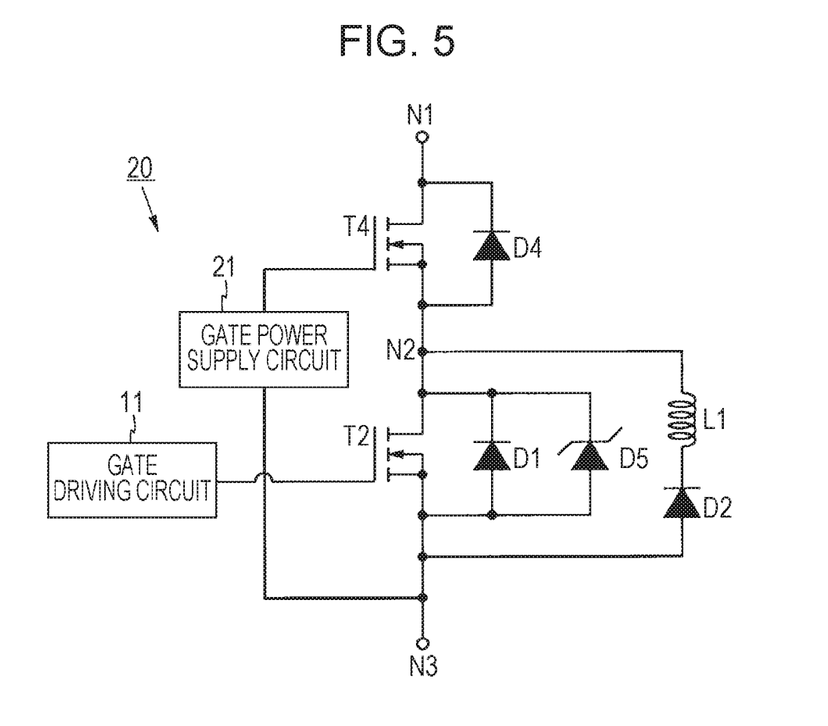
FIG. 5 is a circuit diagram of a switching circuit according to a second embodiment of the invention.

FIG. 5 is a circuit diagram of a switching circuit according to a second embodiment of the invention. A switching circuit 20 illustrated in FIG. 5 includes transistors T2 and T4, diodes D1, D2, D4, and D5, a gate driving circuit 11, and a gate power supply circuit 21. The switching circuit 20 has two normally-off transistors connected in series. In the following description, among components of each embodiment, the same element as that of the embodiment described above will be denoted by the same reference sign and description thereof will be omitted.

In FIG. 5, the transistor T4 is an N-channel and high-withstand-voltage normally-off MOSFET. The diode D4 is an internal diode of the transistor T4. The diode D5 is a Zener diode provided to protect the transistor T2. A diode having forward voltage lower than those of the diodes D1 and D5 is used for the diode D2. Note that, the switching circuit 20 may not include the diode D5. In this manner, in the switching circuit 20, withstand voltage of the transistor T4 is higher than withstand voltage of the transistor T2 and the forward voltage of the diode D2 is lower than the forward voltages of the diodes D1 and D5.

In the present embodiment, a node connected to a drain terminal of the transistor T4 is denoted by N1. A source terminal of the transistor T4 is connected to a drain terminal of the transistor T2. The diodes D1, D2, and D5 are provided in reverse parallel to the transistor T2, and the diode D4 is provided in reverse parallel to the transistor T4. The drain terminal of the transistor T4 and a cathode terminal of the diode D4 are connected to the node N1. The source terminal of the transistor T4, the drain terminal of the transistor T2, cathode terminals of the diodes D1, D2, and D5, and an anode terminal of the diode D4 are connected to the node N2. A source terminal of the transistor T2 and anode terminals of the diodes D1, D2, and D5 are connected to the node N3.

A gate terminal of the transistor T2 is connected to an output terminal of the gate driving circuit 11. A gate terminal of the transistor T4 is connected to the node N3 via the gate power supply circuit 21. The gate power supply circuit 21 applies voltage, which is higher than a potential of the node N3 by a threshold voltage of the transistor T4 or more, to the gate terminal of the transistor T4. Thus, when a potential of the node N2 is equal to the potential of the node N3, the transistor T4 is switched on. Note that, for example, a capacitor to which a power supply is connected in parallel or the like is usable as the gate power supply circuit 21. With such a gate power supply circuit 21, it is possible to always apply a predetermined voltage between the node N3 and the gate terminal of the transistor T4 with a simple configuration. A gate resistance may be provided as necessary in a gate wire of each of the transistors T2 and T4.

Four current paths, that is, a path routed through a channel of the transistor T2, a first path routed through the diode D1, a second path routed through the diode D2, and a path (hereinafter, referred to as a third path) routed through the diode D5 are between the node N2 and the node N3. The switching circuit 20 is configured so that an inductance component of the second path is greater than an inductance component of the first path and an inductance component of the third path. For indicating such a characteristic, an inductance component L1 is illustrated in the second path of the figure. Similarly to the first embodiment, as a method for providing the second path with the inductance component, there are a method for devising a wiring layout on a printed board, a method for using a lead wire of the diode D2, a method for arranging a ferrite bead as appropriate in the second path, and the like.

An operation of the switching circuit 20 will be described below. First, a case where current flows from the node N1 to the node N3 will be described. In this case, the gate driving circuit 11 outputs an on signal. Then, the transistor T2 is switched on and the potential of the node N2 and the potential of the node N3 become almost equal. Due to an effect of the gate power supply circuit 21, voltage which is equal to or more than the threshold voltage is applied between a gate and a source of the transistor T4. Thus, the normally-off transistor T4 is switched on and the current flows from the node N1 to the node N3.

When stopping the current flowing from the node N1 to the node N3, the gate driving circuit 11 outputs an off signal (a signal for switching off the transistor T2). Then, the transistor T2 is switched off. When there is an inductive load, the potential of the node N1 is increased as compared to the potential of the node N3. For a while even after the transistor T2 is switched off, the transistor T4 is kept in the on state and the potential of the node N2 rises with the rise of the potential of the node N1. When the voltage between the gate and the source of the transistor T4 reaches almost the threshold voltage of the transistor T4, the transistor T4 is switched off and the current flowing from the node N1 to the node N3 is stopped. Since the inductance component of the path routed through the channel of the transistor T2 is small, it is possible to perform excellent switching with small surge at the time of turning off.

Next, a case where current flows from the node N3 to the node N1 while the transistor T2 is in the off state will be described. While the transistor T2 is in the off state, almost no current flows through the channel of the transistor T2. On the other hand, the diodes D1, D2, and D5 may cause the current to flow from the node N3 to the node N2. In particular, the first path routed through the diode D1 has a small inductance component, and thus allows the current to immediately flow without causing large surge even when the current starts to flow suddenly. At this time, by conduction of the diode D1, the potential of the node N2 is almost the same as the potential of the node N3 (is lower than the potential of the node N3 by the forward voltage of the diode D1 in a strict sense), and positive voltage which is equal to or more than the threshold voltage of the transistor T4 is applied between the gate and the source of the transistor T4 by an effect of the gate power supply circuit 21. Thereby, the transistor T4 is switched on and the current starts to flow through a channel of the transistor T4 between the node N2 and the node N1. Here, since the forward voltage of the diode D2 is lower than the forward voltages of the diodes D1 and D5, steady-state current easily flows through the diode D2 compared to the diodes D1 and D5. Thus, even in a case of flowing mainly through the first path routed through the diode D1 immediately after the current starts to flow, the current flowing from the node N3 to the node N2 is shifted to the second path routed through the diode D2 whose forward voltage is lower than those of the diodes D1 and D5 and flows mainly through the second path (the path routed through the diode D2) after the current starts to flow. At this time, a cathode potential of the diode D2 is lower than an anode potential by the forward voltage Vf. Since this voltage is a positive voltage, the voltage which is equal to or more than the threshold voltage is applied between the gate and the source of the transistor T4 by an effect of the gate power supply circuit 21. Thus, the transistor T4 is switched on and the current flows from the node N3 to the node N1. At this time, the current mainly flows through the channel of the transistor T4 between the node N1 and the node N2.

Next, considered is a case where while the transistor T2 is in the off state, the current flowing from the node N3 to the node N1 is stopped and the potential of the node N1 is increased as compared to the potential of the node N3. In this case, the potential of the node N2 rises with the rise of the potential of the node N1. When the voltage of the node N2 increases, the voltage between the gate and the source of the transistor T4 is reduced. When the voltage between the gate and the source of the transistor T4 is lower than the threshold voltage, the transistor T4 is switched off. Thus, the switching circuit 20 functions as a high-withstand-voltage rectification circuit by which the current flows from the node N3 to the node N1 and does not flow from the node N1 to the node N3 while the transistor T2 is in the off state.

When a super junction MOSFET or the like is used as the transistor T4, recovery characteristic of the internal diode D4 is deteriorated. Thus, when current flows through the internal diode D4 during rectification, a large amount of reverse recovery current flows when the rectification is stopped and a switching loss is increased, so that other elements may be broken in some cases. In the switching circuit 20, when the current flows from the node N3 to the node N1, the current flows not through the internal diode D4 but through the channel of the transistor T4. Thus, it is possible to reduce the reverse recovery current when the rectification is stopped.

The switching circuit 20 includes the diode D2 in reverse parallel to the transistor T2 between the nodes N2 and N3.

As described above, when the current flows from the node N3 to the node N1 while the transistor T2 is in the off state, the current mainly flows through the second path between the node N3 and the node N2. In a process where this current is reduced, counter electromotive force is generated by the inductance component L1 and the potential of the node N2 becomes higher than the potential of the node N3. When the potential of the node N2 becomes higher, the transistor T4 comes close to the off state. Thus, after the current is stopped, the transistor T4 is immediately switched off. Accordingly, with the switching circuit 20, it is possible to reduce the transient current at the time of turning off similarly to the switching circuit 10 according to the first embodiment.

In the switching circuit 20, a capacitance between the source and the drain of the transistor T4 is often large. In a case where the capacitance between the source and the drain of the transistor T4 is large, when a reverse bias is applied, the potential of the node N2 exceeds withstand voltage of the transistor T2 due to capacitance bonding and the transistor T2 is broken in some cases. Thus, the switching circuit 20 includes the diode D5 in reverse parallel to the transistor T2. When voltage between the drain and the source of the transistor T2 exceeds Zener voltage of the diode D5, current flows through the diode D5. This makes it possible to prevent breakage of the transistor T2 due to excessive application of voltage.

Figure 6:
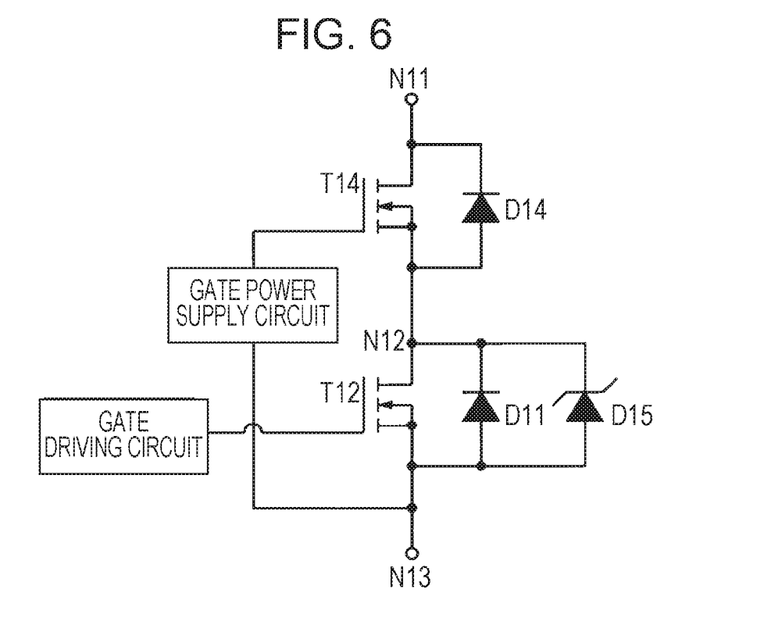
FIG. 6 is a circuit diagram of a switching circuit according to a second comparative example.

An effect of the switching circuit 20 according to the present embodiment will be described below in comparison with a switching circuit (hereinafter, referred to as a switching circuit according to a comparative example) illustrated in FIG. 6. The switching circuit according to the comparative example does not include components corresponding to the diode D2, the inductance component L1, and the second path in comparison with the switching circuit 20.

Considered is a case where current flowing from the node N13 to the node N11 is stopped while the transistor T12 is in the off state in the switching circuit according to the comparative example. In this case, the potential of the node N11 rises after the current is stopped. However, since a transistor T14 is in the on state, the potential of the node N12 rises with the rise of the potential of the node N11. When the potential of the node N12 rises, voltage between a gate and a source of the transistor T14 drops. When the voltage between a gate and a source of the transistor T14 is lower than a threshold voltage, the transistor T14 is switched off. After that, when the potential of the node N11 further rises, the potential of the node N12 is increased due to capacitance bonding between a source and a drain of the transistor T14 and voltage between a source and a drain of the transistor T12 continues to rise, and when reaching breakdown voltage of the Zener diode D15, the potential of the node N12 is clamped by the Zener diode D15. Thereafter, current for charging a capacitance between the source and the drain of the transistor T14, which is associated with rising of the potential of the node N11, flows through the node N13 via the Zener diode D15. In particular, when a super junction MOSFET with low resistance is used as the transistor T14, the capacitance between the source and the drain is particularly large when the voltage between the source and the drain is low, so that the current for charging the capacitance between the source and the drain of the transistor T14, which is associated with rising of the potential of the node N11, also increases.

In the switching circuit according to the comparative example, the transistor T14 is in the on state for a while after the potential of the node N11 rises. As a time period when the transistor T14 is in the on state is longer, transient current at the time of switching increases. By impedance of wires connecting a gate terminal of the transistor T14 and the node N13, a delay may be caused between rising of the potential of the node N12 and switching off of the transistor T14. When this delay is long, the voltage between the drain and the source of the transistor T12 reaches the Zener voltage of the diode D15 in some cases before the transistor T14 is switched off. In this case, the current flows from the node N11 to the diode D15 via a channel of the transistor T14. Thus, a heat generation amount in the diode D15 increases and a switching loss increases.

On the other hand, in the switching circuit 20 according to the present embodiment, the transistor T4 is immediately switched off at the time of turning off. Thus, it is possible to reduce the transient current at the time of turning off. It is also possible to reduce a heat generation amount in the diode D5 and suppress a switching loss.

As described above, in the switching circuit 20 according to the present embodiment, a first transistor T4 and a second transistor T2 are normally-off transistors and a control terminal (gate terminal) of the first transistor is connected to the third node N3 via the power supply circuit (gate power supply circuit 21). Thus, it is possible to reduce the transient current at the time of turning off in the switching circuit including the two normally-off transistors connected in series.

The switching circuit 20 includes a protection diode D5 that is provided in reverse parallel to the second transistor on the third path connecting the second node N2 and the third node. This makes it possible to prevent breakage of the second transistor due to excessive application of voltage.

Note that, the switching circuit 20 may further include a capacitor provided in parallel to the diode D2. One electrode of the capacitor is connected to the cathode terminal of the diode D2 and the other electrode of the capacitor is connected to an anode terminal of the diode D2. By providing the capacitor, it is possible to prevent, when the switching circuit 20 is switched, high-frequency oscillation due to a capacitance component of the diode D2 and the inductance component L1 of the second path in the switching circuit 20, and operate the switching circuit 20 stably.

Third Embodiment

Figure 7:
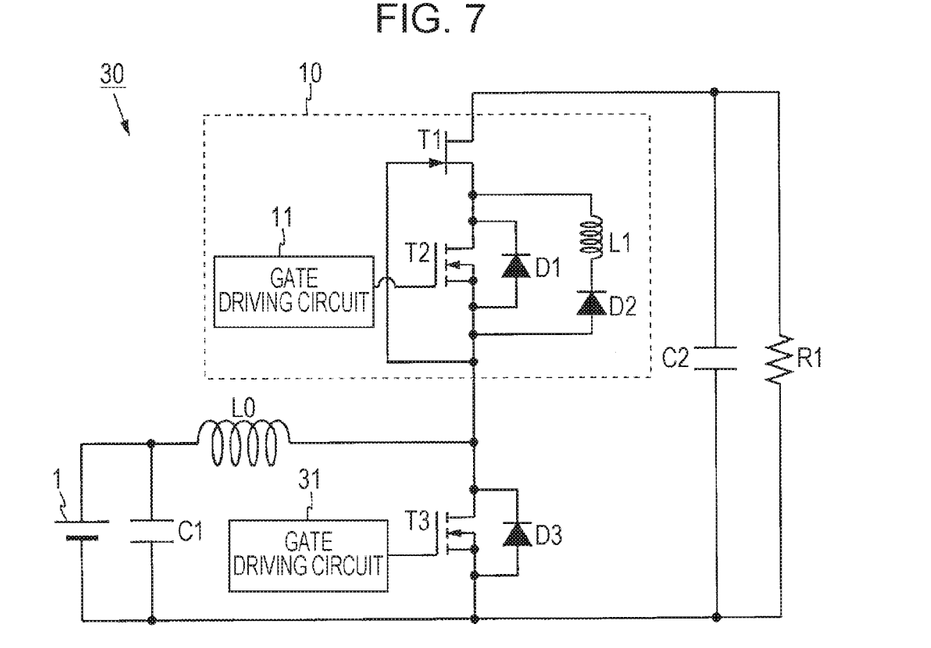
FIG. 7 is a circuit diagram of a power supply circuit according to a third embodiment of the invention.

FIG. 7 is a circuit diagram of a power supply circuit according to a third embodiment of the invention. A power supply circuit 30 illustrated in FIG. 7 is a step-up chopper circuit including a switching circuit 10, a transistor T3, a diode D3, a gate driving circuit 31, a coil L0, and capacitors C1 and C2. In FIG. 7, the power supply circuit 30 is connected to a power supply 1 and a load R1. The capacitor C1 is provided in parallel to the power supply 1 and the capacitor C2 is provided in parallel to a load R1. Note that, the power supply circuit 30 may not include the capacitors C1 and C2.

The switching circuit 10 is the circuit described in the first embodiment. The transistor T3 is an N-channel and normally-off transistor. The diode D3 is provided in reverse parallel to the transistor T3. A cathode terminal of the diode D3 is connected to a drain terminal of the transistor T3, and an anode terminal of the diode D3 is connected to a source terminal of the transistor T3. For example, an internal diode of the transistor T3 is used for the diode D3. A gate terminal of the transistor T3 is connected to an output terminal of the gate driving circuit 31. Note that, the power supply circuit 30 may not include the diode D3.

One terminal (right-side terminal in FIG. 7) of the coil L0 is connected to a source terminal of the transistor T2 and the drain terminal of the transistor T3. The other terminal of the coil L0 is connected to a positive electrode of the power supply 1. A drain terminal of the transistor T1 is connected to a high-side terminal of the load R1. The source terminal of the transistor T3 is connected to a negative electrode of the power supply 1 and a low-side terminal of the load R1. The switching circuit 10 functions as an upper-side switching circuit provided in an upper-side arm. The transistor T3, the diode D3, and the gate driving circuit 31 function as a lower-side switching circuit provided in a lower-side arm. One terminal of the coil L0 is connected to an arm connection point.

The gate driving circuit 31 outputs a PWM (Pulse Width Modulation) signal having a predetermined duty ratio to the gate terminal of the transistor T3. The gate driving circuit 11 outputs, to a gate terminal of the transistor T2, a signal that complementarily changes with respect to the PWM signal while having a dead time. Note that, the dead time refers to a time period in which both of the transistors T2 and T3 are switched off, that is, a time period in which each of the gate driving circuits 11 and 31 outputs an off signal. The gate driving circuit 11 outputs an on signal in a part of a time period in which the gate driving circuit 31 outputs an off signal. The gate driving circuit 31 outputs an on signal in a part of the time period in which the gate driving circuit 11 outputs the off signal.

The switching circuit 10 provided in the upper-side arm functions as a rectification circuit by which current flows in a direction (upward in FIG. 7) from the arm connection point toward the high-side terminal of the load R1. Therefore, by providing the gate terminal of the transistor T3 provided in the lower-side arm with the PWM signal, power supply voltage supplied from the power supply 1 is able to be increased and voltage higher than the power supply voltage is able to be applied to the load R1. Further, by providing the switching circuit 10 in the upper-side arm, it is possible to immediately switch off the transistor T1 when the rectification is stopped and reduce the transient current at the time of turning off.

A signal that complementarily changes with respect to the PWM signal, which is applied to the gate terminal of the transistor T3, while having a dead time is applied to the gate terminal of the transistor T2. In this manner, by temporarily switching on the transistor T2 while the transistor T3 is in the off state, it is possible to cause current to flow through a low-resistance channel of the transistor T2, prevent voltage drop when the current passes through the diodes D1 and D2, and reduce a conduction loss.

By switching off the transistor T2 at a suitable timing before the transistor T3 is switched on, the current which has been flowing through the channel of the transistor T2 flows via the diode D2 having low forward voltage. Moreover, when the transistor T3 is switched on, the transistor T1 is immediately switched off. Thus, a switching loss when the transistor T3 is switched on and the switching circuit 10 is turned off is able to be reduced.

More specifically, in the dead time period until the transistor T3 is switched on after the transistor T2 is switched off, current firstly flows through a path routed through the diode D1 with a small inductance component, and then shifts to a second path routed through the diode D2 having low forward voltage. Therefore, the dead time is desired to be set so that the transistor T3 is switched on after at least a part of the current shifts to the path routed through the diode D2. On the other hand, when the dead time is excessively long, a time period in which the current flows through the low-resistance channel of the transistor T2 becomes short and a time period in which the current flows through the diodes D1 and D2 becomes long, so that a diode passage loss increases. Thus, the dead time is preferably set within a range of 200 ns to 5 μs.

As described above, the power supply circuit 30 according to the present embodiment includes the switching circuit 10 as the upper-side switching circuit, includes a third transistor T3 as the lower-side switching circuit and a second driving circuit (gate driving circuit 31) that outputs a pulse width modulation signal to a control terminal (gate terminal) of the third transistor, and includes the coil L0 having one terminal connected to the arm connection point. In this manner, by arranging the switching circuit 10, in which the transient current at the time of turning off is reduced, in the upper-side arm and performing pulse width modulation for the third transistor T3 provided in the lower-side arm, it is possible to configure a step-up chopper circuit in which a switching loss is reduced.

The driving circuit (gate driving circuit 11) included in the switching circuit 10 outputs, to a control terminal of the second transistor T2, a signal that complementarily changes with respect to the pulse width modulation signal while providing a dead time. Thus, as described above, it is possible to prevent voltage drop by the diodes D1 and D2 and reduce a conduction loss.

Fourth Embodiment

Figure 8:
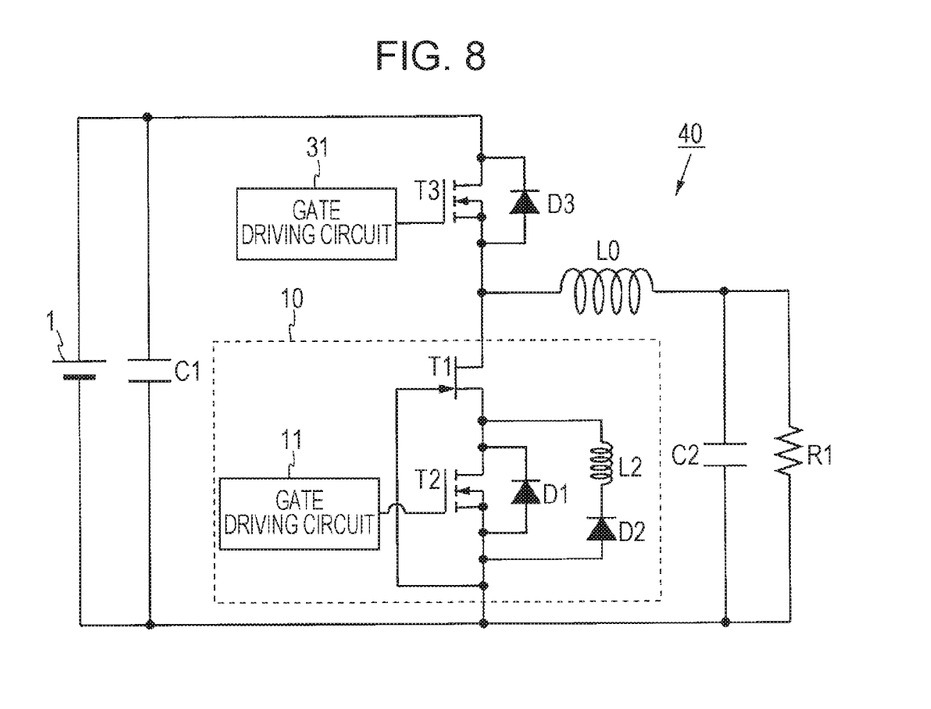
FIG. 8 is a circuit diagram of a power supply circuit according to a fourth embodiment of the invention.

FIG. 8 is a circuit diagram of a power supply circuit according to a fourth embodiment of the invention. A power supply circuit 40 illustrated in FIG. 8 is a step-down chopper circuit including a switching circuit 10, a transistor T3, a diode D3, a gate driving circuit 31, a coil L0, and capacitors C1 and C2. In FIG. 8, the power supply circuit 40 is connected to a power supply 1 and a load R1. Connection methods of the capacitors C1 and C2 are the same as those of the third embodiment.

The switching circuit 10 is the circuit described in the first embodiment. Connection methods of the transistor T3, the diode D3, and the gate driving circuit 31 are the same as those of the third embodiment. One terminal (left-side terminal in FIG. 8) of the coil L0 is connected to a source terminal of the transistor T3 and a drain terminal of the transistor T1. The other terminal of the coil L0 is connected to a high-side terminal of the load R1. A drain terminal of the transistor T3 is connected to a positive electrode of the power supply 1. A source terminal of the transistor T2 is connected to a negative electrode of the power supply 1 and a low-side terminal of the load R1. The switching circuit 10 functions as a lower-side switching circuit provided in a lower-side arm. The transistor T3, the diode D3, and the gate driving circuit 31 function as an upper-side switching circuit provided in an upper-side arm. One terminal of the coil L0 is connected to an arm connection point.

The gate driving circuit 31 outputs a PWM signal having a predetermined duty ratio to a gate terminal of the transistor T3. The gate driving circuit 11 outputs, to a gate terminal of the transistor T2, a signal that complementarily changes with respect to the PWM signal while having a dead time.

The switching circuit 10 provided in the lower-side arm functions as a rectification circuit by which current flows in a direction (upward in FIG. 8) from the negative electrode of the power supply 1 toward the arm connection point. Therefore, by providing the gate terminal of the transistor T3 provided in the upper-side arm with the PWM signal, power supply voltage supplied from the power supply 1 is able to be reduced and voltage lower than the power supply voltage is able to be applied to the load R1. Further, by using the switching circuit 10 for the lower-side arm, it is possible to immediately switch off the transistor T1 when the rectification is stopped and reduce the transient current at the time of turning off.

A signal that complementarily changes with respect to the PWM signal, which is applied to the gate terminal of the transistor T3, while having a dead time is applied to the gate terminal of the transistor T2. In this manner, by temporarily switching on the transistor T2 while the transistor T3 is in the off state, it is possible to cause current to flow through a low-resistance channel of the transistor T2, prevent voltage drop by the diodes D1 and D2, and reduce a conduction loss.

By switching off the transistor T2 at a suitable timing before the transistor T3 is switched on, the current which has been flowing through the channel of the transistor T2 flows via the diode D2 having low forward voltage. Moreover, when the transistor T3 is switched on, the transistor T1 is immediately switched off. Thus, a switching loss when the switching circuit 10 is turned off is able to be reduced.

As described above, the power supply circuit 40 according to the present embodiment includes the switching circuit 10 as the lower-side switching circuit, includes a third transistor T3 as the upper-side switching circuit and a second driving circuit (gate driving circuit 31) that outputs a pulse width modulation signal to a control terminal (gate terminal) of the third transistor, and includes the coil L0 having one terminal connected to the arm connection point. In this manner, by arranging the switching circuit 10, in which the transient current at the time of turning off is reduced, in the lower-side arm and performing pulse width modulation for the third transistor T3 provided in the upper-side arm, it is possible to configure a step-down chopper circuit in which a switching loss is reduced.

The driving circuit (gate driving circuit 11) included in the switching circuit 10 outputs, to a control terminal of the second transistor T2, a signal that complementarily changes with respect to the pulse width modulation signal while providing a dead time. Thus, as described above, it is possible to prevent voltage drop by the diodes D1 and D2 and reduce a conduction loss.

Fifth Embodiment

Figure 9:
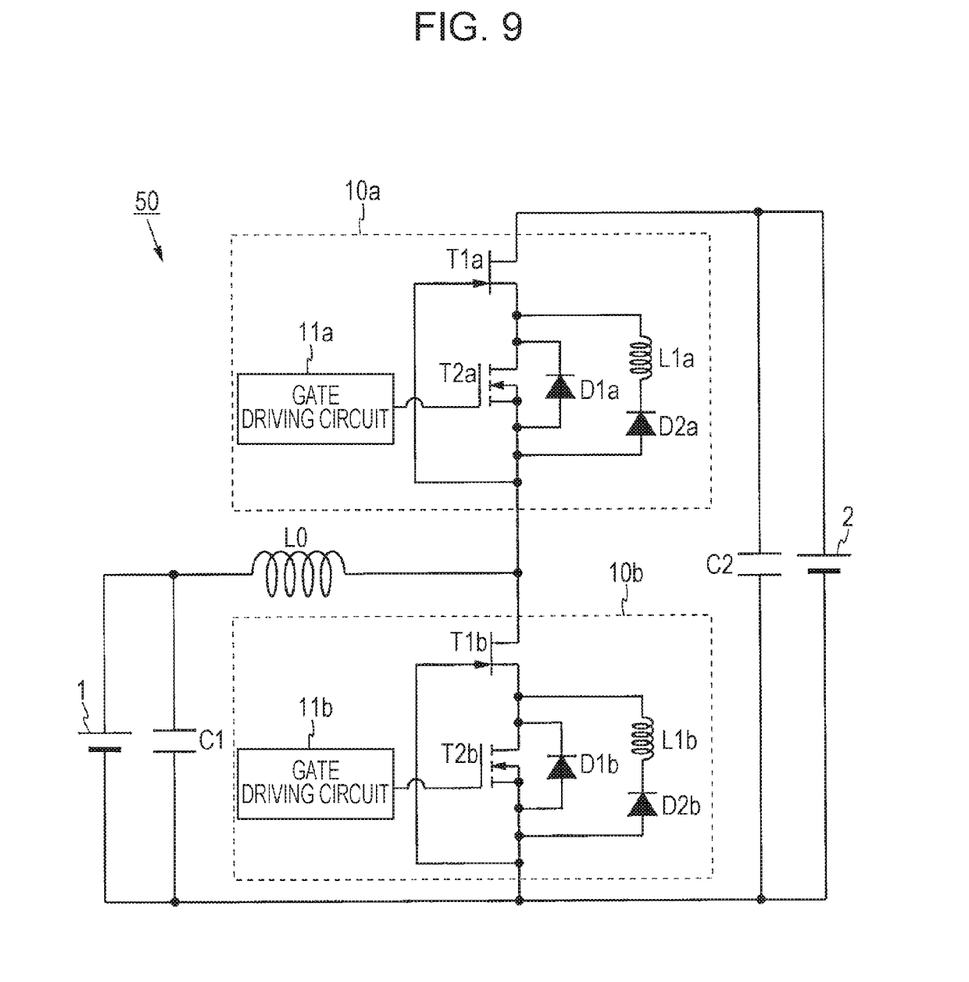
FIG. 9 is a circuit diagram of a power supply circuit according to a fifth embodiment of the invention.

FIG. 9 is a circuit diagram of a power supply circuit according to a fifth embodiment of the invention. A power supply circuit 50 illustrated in FIG. 9 includes switching circuits 10a and 10b, a coil L0, and capacitors C1 and C2. The power supply circuit 50 functions as a bidirectional chopper circuit or an inverter. In FIG. 9, the power supply circuit 50 is connected to power supplies 1 and 2. It is assumed that power supply voltage supplied from the power supply 1 is lower than power supply voltage supplied from the power supply 2. The capacitor C1 is provided in parallel to the power supply 1 and the capacitor C2 is provided in parallel to the power supply 2.

Each of the switching circuits 10a and 10b is the circuit described in the first embodiment. The switching circuit 10a includes transistors T1a and T2a, diodes D1a and D2a, and a gate driving circuit 11a. The switching circuit 10b includes transistors T1b and T2b, diodes D1b and D2b, and a gate driving circuit 11b. Note that, for indicating that an inductance component of a second path is greater than an inductance component of a first path, inductance components L1a and L1b are respectively illustrated in second paths of the switching circuits 10a and 10b in the figure.

One terminal (right-side terminal in FIG. 9) of the coil L0 is connected to a source terminal of the transistor T2a and a drain terminal of the transistor T1b. The other terminal of the coil L0 is connected to a positive electrode of the power supply 1. A drain terminal of the transistor T1a is connected to a positive electrode of the power supply 2. A source terminal of the transistor T2b is connected to negative electrodes of the power supplies 1 and 2. The switching circuit 10a functions as an upper-side switching circuit provided in an upper-side arm. The switching circuit 10b functions as a lower-side switching circuit provided in a lower-side arm. The one terminal of the coil L0 is connected to an arm connection point.

A case where the power supply circuit 50 is used as a bidirectional chopper circuit will be described below. When power is transferred from the power supply 1 on a low-voltage side to the power supply 2 on a high-voltage side, the gate driving circuit 11a outputs an off signal to a gate terminal of the transistor T2a. Thereby, the switching circuit 10a functions as a rectification circuit by which current flows via the diode D2a and the transistor T1a to a direction (upward in FIG. 9) from the arm connection point toward the positive electrode of the power supply 2. The gate driving circuit 11b outputs a PWM signal to a gate terminal of the transistor T2b. In this manner, when the switching circuit 10a provided in the upper-side arm functions as the rectification circuit and the transistor T2b provided in the lower-side arm is subjected to pulse width modulation, the power supply circuit 50 is able to function as a step-up chopper circuit that transfers power from the power supply 1 on the low-voltage side to the power supply 2 on the high-voltage side.

Note that, similarly to the third embodiment, the gate driving circuit 11a may output, to the gate terminal of the transistor T2a, a signal that complementarily changes with respect to the PWM signal, which is output from the gate driving circuit 11b, while having a dead time. In this manner, by temporarily switching on the transistor T2a during conduction of the upper-side arm, it is possible to cause current to flow through a low-resistance channel of the transistor T2a, and suppress a loss due to voltage drop when passing through the diode D2a.

When power is transferred from the power supply 2 on the high-voltage side to the power supply 1 on the low-voltage side, the gate driving circuit 11b outputs an off signal to the gate terminal of the transistor T2b. Thereby, the switching circuit 10b functions as a rectification circuit by which current flows via the diode D2b and the transistor T1b to a direction (upward in FIG. 9) from the negative electrode of the power supply 2 toward the arm connection point. The gate driving circuit 11a outputs a PWM signal to the gate terminal of the transistor T2a. In this manner, when the switching circuit 10b provided in the lower-side arm functions as the rectification circuit and the transistor T2a provided in the upper-side arm is subjected to pulse width modulation, the power supply circuit 50 is able to function as a step-down chopper circuit that transfers power from the power supply 2 on the high-voltage side to the power supply 1 on the low-voltage side.

Note that, similarly to the fourth embodiment, the gate driving circuit 11b may output, to the gate terminal of the transistor T2b, a signal that complementarily changes with respect to the PWM signal, which is output from the gate driving circuit 11a, while having a dead time. In this manner, by temporarily switching on the transistor T2b during conduction of the lower-side arm, it is possible to cause current to flow through a low-resistance channel of the transistor T2b, and suppress a loss due to voltage drop when passing through the diode D2b.

The power supply circuit 50 includes the switching circuit 10a in the upper-side arm and the switching circuit 10b in the lower-side arm. In the switching circuits 10a and 10b, by immediately switching off the high-withstand-voltage transistors T1a and T1b when rectification is stopped, it is possible to reduce the transient current at the time of turning off. Therefore, in a case where a step-up operation is performed, by immediately switching off the transistor T1a when rectification is stopped and reducing the transient current at this time, it is possible to reduce a switching loss. In a case where a step-down operation is performed, by immediately switching off the transistor T1b when rectification is stopped and reducing the transient current at this time, it is possible to reduce a switching loss. Almost no current flows through a path having an inductance component in the switching-side arm but the current flows through a path having a small inductance component, thus making it possible to prevent generation of surge.

As described above, with the power supply circuit 50 according to the present embodiment, by providing the switching circuits, in which the transient current at the time of turning off is reduced, in the upper-side arm and the lower-side arm, it is possible to configure a bidirectional chopper circuit and an inverter in which a switching loss is reduced.

Sixth Embodiment

Figure 10:
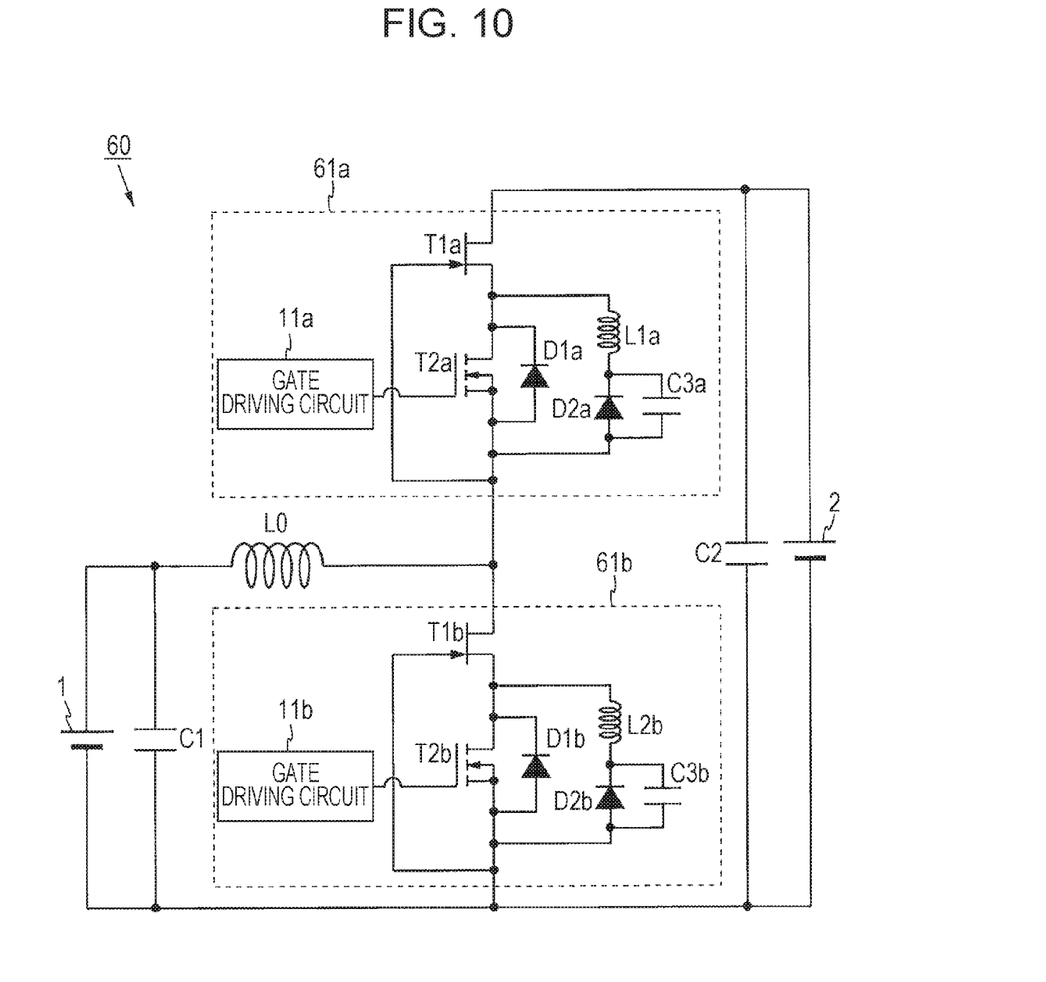
FIG. 10 is a circuit diagram of a power supply circuit according to a sixth embodiment of the invention.

FIG. 10 is a circuit diagram of a power supply circuit according to a sixth embodiment of the invention. A power supply circuit 60 illustrated in FIG. 10 is obtained by respectively replacing the switching circuits 10a and 10b of the power supply circuit 50 according to the fifth embodiment with switching circuits 61a and 61b. The switching circuit 61a is obtained by adding a capacitor C3a to the switching circuit 10a described in the fifth embodiment. The capacitor C3a is provided in parallel to a diode D2a. One electrode (upper-side electrode in FIG. 10) of the capacitor C3a is connected to a cathode terminal of the diode D2a and the other electrode of the capacitor C3a is connected to an anode terminal of the diode D2a. The switching circuit 61b is obtained by adding a capacitor C3b with a similar method to the switching circuit 10b described in the fifth embodiment. As the capacitors C3a and C3b, for example, ones having capacitance of about 10 pF to 1 nF are used.

By providing the capacitor C3a, it is possible to prevent, when the switching circuit 10a is switched, high-frequency oscillation due to a capacitance component of the diode D2a and an inductance component L1a of a second path in the switching circuit 10a. Further, by providing the capacitor C3b, it is possible to prevent, when the switching circuit 10b is switched, high-frequency oscillation due to a capacitance component of the diode D2b and an inductance component L1b of a second path in the switching circuit 10b.

Note that, some diodes have a parasitic capacitance of about 10 pF to 1 nF as a component. By using diodes having a parasitic capacitance of a required quantity as the diodes D2a and D2b, it is possible to obtain the same effect as that of a case where the capacitors C3a and C3b are added as components. With this method, it is not necessary to add the capacitor C3a or C3b as a component.

Some ferrite beads have characteristic that a mixing rate of an inductance component and a resistance component varies depending on a frequency band. Thus, when a ferrite bead is used as a part of the inductance components L1a and L1b of the second path, there is a method for using a bead component that functions mainly as an inductance with a certain frequency band or less (for example, 1 MHz or less) and functions mainly as a resistance with the frequency band or more (for example, 1 MHz or more). Such a bead component functions mainly as an inductance in the case of rectified current with a low frequency and functions mainly as a resistance in the case of a high-frequency oscillation component caused by switching noise. With such a method, it is possible to reduce capacitances of the capacitors C3a and C3b connected in parallel to the diodes D2a and D2b.

As described above, in the power supply circuit 60 according to the present embodiment, the switching circuits 61a and 61b respectively include the capacitors C3a and C3b provided in parallel to the second diodes D2a and D2b. Thus, it is possible to prevent, at a time of switching, high-frequency oscillation caused by the capacitance components of the diodes D2a and D2b and the inductance components L1a and L1b of the second path, and operate the switching circuit 60 stably.

Note that, various modified examples of the embodiments described above are able to be configured. For example, each of the power supply circuits 30, 40, 50, and 60 according to the third to sixth embodiments may include the switching circuit 20 according to the second embodiment instead of the switching circuit 10 according to the first embodiment. In this case, the switching circuit 20 may not include the diode D5. Similarly to the power supply circuit 30 according to the third embodiment, each of the power supply circuits 40, 50, and 60 according to the fourth to sixth embodiments may not include the capacitor C1 or C2. Similarly to the switching circuits 61a and 61b included in the power supply circuit 60 according to the sixth embodiment, the switching circuit 10 included in each of the power supply circuits 30 and 40 according to the third and fourth embodiments may include a capacitor in parallel to the second diode D2. A switching circuit and a power supply circuit having features of a plurality of embodiments are able to be configured by freely combining features of the embodiments described above unless contrary to the nature thereof.

INDUSTRIAL APPLICABILITY

The switching circuit of the invention has a feature that the transient current at the time of turning off is small, and is thus able to be used for switching circuits of various electric equipment and electronic equipment, and the like. The power supply circuit of the invention has a feature that a switching loss is small, and is thus able to be used for power supply circuits of various electric equipment and electronic equipment, and the like.

REFERENCE SIGNS LIST 10, 20, 61 switching circuit
11, 31 gate driving circuit
21 gate power supply circuit
30, 40, 50, 60 power supply circuit
T1 to T4 transistor
D1 to D5 diode
C1 to C3 capacitor
L0 coil
L1 inductance component
N1 to N3 node

The invention claimed is:

1. A switching circuit, comprising:
a first transistor that includes a first conductive terminal connected to a first node and a second conductive terminal connected to a second node;
a second transistor that includes a first conductive terminal connected to the second node and a second conductive terminal connected to a third node;
a first diode that is provided in reverse parallel to the second transistor on a first path connecting the second and third nodes;
a second diode that is provided in reverse parallel to the second transistor on a second path connecting the second and third nodes; and
a driving circuit that outputs a control signal to a control terminal of the second transistor, wherein
a control terminal of the first transistor is connected to the third node directly or via a passive element or a power supply circuit,
withstand voltage of the first transistor is higher than withstand voltage of the second transistor,
forward voltage of the second diode is lower than forward voltage of the first diode,
the first path has a first inductance component,
the second path has a second inductance component,
the second inductance component is greater than the first inductance component, and
when a direction of current flowing from the third node to the first node changes to a reverse direction, in a process where the current flowing from the third node to the first node decreases, a potential of the second node becomes higher and the first transistor comes close to an off state by generating counter electromotive force by the second inductance component, and the direction of the current changes to the reverse direction after the first transistor comes close to the off state.

2. The switching circuit according to claim 1, wherein
the first transistor is a normally-on transistor,
the second transistor is a normally-off transistor, and
the control terminal of the first transistor is connected to the third node directly or via the passive element.

3. The switching circuit according to claim 1, wherein
the first and second transistors are normally-off MOSFETs each having a parasitic diode,
the control terminal of the first transistor is connected to the third node via the power supply circuit, and
a voltage supplied from the power supply circuit is a positive voltage which is equal to or more than a threshold voltage of the first transistor.

4. The switching circuit according to claim 1, further comprising
a protection diode that is provided in reverse parallel to the second transistor on a third path connecting the second and third nodes, wherein
the protection diode is a Zener diode, and
forward voltage of the protection diode is higher than the forward voltage of the second diode.

5. The switching circuit according to claim 4, wherein
the third path has a third inductance component, and
the third inductance component is smaller than the second inductance component.

6. The switching circuit according to claim 1, wherein the first diode is an internal diode of the second transistor.

7. The switching circuit according to claim 1, wherein a wire length of the second path is longer than a wire length of the first path.

8. The switching circuit according to claim 1, wherein at least a part of the second inductance component is configured by a ferrite bead.

9. A power supply circuit, comprising:
an upper-side switching circuit provided in an upper-side arm;
a lower-side switching circuit provided in a lower-side arm; and
a coil, one terminal of which is connected to an arm connection point,
wherein at least one of the upper-side and lower-side switching circuits is a switching circuit that includes:
a first transistor that includes a first conductive terminal connected to a first node and a second conductive terminal connected to a second node;
a second transistor that includes a first conductive terminal connected to the second node and a second conductive terminal connected to a third node;
a first diode that is provided in reverse parallel to the second transistor on a first path connecting the second and third nodes;
a second diode that is provided in reverse parallel to the second transistor on a second path connecting the second and third nodes; and
a driving circuit that outputs a control signal to a control terminal of the second transistor, and
wherein a control terminal of the first transistor is connected to the third node directly or via a passive element or a power supply circuit,
withstand voltage of the first transistor is higher than withstand voltage of the second transistor,
forward voltage of the second diode is lower than forward voltage of the first diode,
the first path has a first inductance component,
the second path has a second inductance component,
the second inductance component is greater than the first inductance component, and
when a direction of current flowing from the third node to the first node changes to a reverse direction, in a process where the current flowing from the third node to the first node decreases, a potential of the second node becomes higher and the first transistor comes close to an off state by generating counter electromotive force by the second inductance component, and the direction of the current changes to the reverse direction after the first transistor comes close to the off state.

10. The power supply circuit according to claim 9, wherein
the upper-side switching circuit is the switching circuit, and
the lower-side switching circuit includes a third transistor and a second driving circuit that outputs a pulse width modulation signal to a control terminal of the third transistor.

11. The power supply circuit according to claim 10, wherein the driving circuit outputs, to a control terminal of the second transistor, a signal that complementarily changes with respect to the pulse width modulation signal while having a dead time.

12. The power supply circuit according to claim 9, wherein
the lower-side switching circuit is the switching circuit, and
the upper-side switching circuit includes a third transistor and a second driving circuit that outputs a pulse width modulation signal to a control terminal of the third transistor.

13. The power supply circuit according to claim 12, wherein the driving circuit outputs, to a control terminal of the second transistor, a signal that complementarily changes with respect to the pulse width modulation signal while having a dead time.

14. The power supply circuit according to claim 9, wherein each of the upper-side and lower-side switching circuits is the switching circuit.

15. The power supply circuit according to claim 9, wherein at least a part of the second inductance component is configured by a ferrite bead.

* * * * *